(12) United States Patent
Huh et al.

(10) Patent No.: US 10,043,998 B2
(45) Date of Patent: Aug. 7, 2018

(54) METHOD OF MANUFACTURING THE DISPLAY APPARATUS INCLUDING FIRST INORGANIC LAYER AND SECOND INORGANIC LAYER

(71) Applicants: Samsung Display Co., Ltd., Yongin-si, Gyeonggi-do (KR); Research & Business Foundation Sungkyunkwan University, Suwon, Gyeonggi-do (KR)

(72) Inventors: Myungsoo Huh, Yongin-si (KR); Sungmin Cho, Suwon (KR); Dongkyun Ko, Yongin-si (KR); Sungchul Kim, Yongin-si (KR); Inkyo Kim, Yongin-si (KR); Cheollae Roh, Yongin-si (KR); Sangjoon Seo, Suwon (KR); Seungwoo Seo, Suwon (KR); Choelmin Jang, Yongin-si (KR)

(73) Assignees: Samsung Display Co., Ltd., Yongin-si (KR); Research & Business Foundation Sungkyunkwan University, Suwon (KR)

(*) Notice: Subject to any disclaimer, the term of this patent is extended or adjusted under 35 U.S.C. 154(b) by 0 days.

(21) Appl. No.: 15/442,095

(22) Filed: Feb. 24, 2017

(65) Prior Publication Data
US 2017/0170429 A1 Jun. 15, 2017

Related U.S. Application Data

(62) Division of application No. 14/819,381, filed on Aug. 5, 2015, now Pat. No. 9,587,311.

(30) Foreign Application Priority Data

Mar. 4, 2015 (KR) .................. 10-2015-0030548

(51) Int. Cl.
*H01L 51/50* (2006.01)
*H01L 51/52* (2006.01)
(Continued)

(52) U.S. Cl.
CPC .... *H01L 51/5253* (2013.01); *C23C 16/45525* (2013.01); *C23C 16/45565* (2013.01);
(Continued)

(58) Field of Classification Search
CPC ... H01L 51/50; H01L 51/5246; H01L 51/525; H01L 51/5253
See application file for complete search history.

(56) References Cited

U.S. PATENT DOCUMENTS

2003/0216028 A1   11/2003   Yoon
2006/0097305 A1   5/2006    Lee
(Continued)

FOREIGN PATENT DOCUMENTS

KR   2003-0089746 A   11/2003
KR   10-2005-0002011 A   1/2005
(Continued)

OTHER PUBLICATIONS

Seo, Seung-Woo et al, "Optimization of $Al_2O_3/ZrO_2$ nanolaminate structure for thin-film encapsulation of OLEDs", Organic Electronics, Jul. 26, 2012, pp. 2436-2441, vol. 13.

*Primary Examiner* — Hoai V Pham
(74) *Attorney, Agent, or Firm* — Lewis Roca Rothgerber Christie LLP

(57) ABSTRACT

A display apparatus and an apparatus for and method of manufacturing the display apparatus. The display apparatus includes: a substrate; a display unit formed on the substrate; and a thin film encapsulation layer formed on the display unit. The thin film encapsulation layer includes an inorganic layer, and the inorganic layer includes a first sub-inorganic
(Continued)

layer including a compound oxide including at least two of aluminum (Al), zinc (Zn), zirconium (Zn), and hafnium (Hf).

17 Claims, 7 Drawing Sheets

(51) Int. Cl.
  *C23C 16/455* (2006.01)
  *H01L 51/56* (2006.01)
  *H01L 27/32* (2006.01)

(52) U.S. Cl.
  CPC .......... *H01L 51/56* (2013.01); *H01L 27/3244* (2013.01); *H01L 2251/303* (2013.01)

(56) References Cited

U.S. PATENT DOCUMENTS

| | | |
|---|---|---|
| 2007/0231592 A1 | 10/2007 | Agata |
| 2007/0267973 A1 | 11/2007 | Suh |
| 2013/0009264 A1 | 1/2013 | Pankow et al. |
| 2016/0254487 A1* | 9/2016 | Harikrishna Mohan ................ H01L 51/5253 428/213 |

FOREIGN PATENT DOCUMENTS

| | | |
|---|---|---|
| KR | 10-2006-0052474 A | 5/2006 |
| KR | 10-2007-0098621 A | 10/2007 |
| WO | WO 2011/103341 A1 | 8/2011 |

* cited by examiner

METHOD OF MANUFACTURING THE DISPLAY APPARATUS INCLUDING FIRST INORGANIC LAYER AND SECOND INORGANIC LAYER

CROSS-REFERENCE TO RELATED APPLICATION

This application is a divisional of U.S. patent application Ser. No. 14/819,381, filed Aug. 5, 2015, which claims priority to and the benefit of Korean Patent Application No. 10-2015-0030548, filed on Mar. 4, 2015, in the Korean Intellectual Property Office, the entire contents of both of which are incorporated herein by reference.

BACKGROUND

1. Field

One or more example embodiments relate to an apparatus and method, and more particularly, to a display apparatus and an apparatus for and method of manufacturing the display apparatus.

2. Description of the Related Art

Semiconductor devices, display apparatuses, and other electronic devices include a plurality of thin films. Several methods of forming thin films have been developed and one example in this regard is vapor deposition.

In vapor deposition, one or more gases are used as a source material for forming thin films. The vapor deposition may be classified into chemical vapor deposition (CVD), atomic layer deposition (ALD), or the like.

In ALD, a source material is injected into a ALD apparatus and then purged or pumped. Then, a monomolecular layer or multiple molecular layers are adhered to the substrate and another material is injected into the ALD apparatus and purged or pumped, thereby forming a monoatomic layer or multiple atomic layers as desired.

Among the display apparatuses, an organic light-emitting display apparatus has a wide viewing angle, a good contrast ratio, and a fast response speed and thus has drawn attention as a next-generation display apparatus.

The organic light-emitting display apparatus includes a first electrode, a second electrode opposite the first electrode, and an intermediate layer therebetween and may further include one or more thin films. In this case, the thin films may be formed through deposition.

However, as a size of the organic light-emitting display apparatus and the demand for high resolution display apparatuses have increased, it is difficult to deposit large thin films as desired. Also, there is a limit on improving the efficiency of processes of forming the thin films.

SUMMARY

One or more aspects of one or more example embodiments include a display apparatus and a method of and apparatus for manufacturing the display apparatus.

Additional aspects will be set forth in part in the description which follows and, in part, will be apparent from the description, or may be learned by practice of the presented embodiments.

According to one or more example embodiments, a display apparatus includes: a substrate; a display unit formed on the substrate; and a thin film encapsulation layer formed on the display unit. The thin film encapsulation layer includes an inorganic layer, and the inorganic layer includes a first sub-inorganic layer including a compound oxide including at least two of (at least two selected from) aluminum (Al), zinc (Zn), zirconium (Zn), and hafnium (Hf).

The inorganic layer may include a second sub-inorganic layer including a compound oxide different from the compound oxide in the first sub-inorganic layer.

The second sub-inorganic layer may be stacked on the first sub-inorganic layer.

The thin film encapsulation layer may further include an organic layer stacked on the inorganic layer.

The substrate may include polyimide.

The first sub-inorganic layer may be amorphous.

A thickness of the first sub-inorganic layer may be less than or equal to 10 nm.

The inorganic layer may be stacked on the first sub-inorganic layer and may further include a second sub-inorganic layer including one of (one selected from) a metal oxide and a metal nitride.

According to one or more example embodiments, a display apparatus includes: a substrate; a display unit formed on the substrate; and a thin film encapsulation layer formed on the display unit. The thin film encapsulation layer includes an inorganic layer, and the inorganic layer includes: a first sub-inorganic layer including one of an aluminum oxide (Al2O3), a zinc oxide (ZnO), a zirconium oxide (ZrO2), and a hafnium oxide (HfO2); and a second sub-inorganic layer including another one of Al2O3, ZnO, ZrO2, and HfO2.

According to one or more example embodiments, an apparatus for manufacturing a display apparatus, includes: a chamber; a shower head installed in the chamber and configured to spray processing gases; a gas supplier configured to supply the processing gas to the shower head; and a substrate supporter installed in the chamber and configured to support a substrate. The shower head is configured to form an inorganic layer including a compound oxide including at least two of aluminum (Al), zinc (Zn), zirconium (Zr), and hafnium (Hf).

The shower head may include: a first spraying unit; and a second spraying unit arranged adjacent to the first spraying unit. The processing gases sprayed by the first spraying unit and the second spraying unit spray may be different from one another.

The first spraying unit and the second spraying unit may concurrently (e.g., simultaneously) spray the processing gases.

The first spraying unit and the second spraying unit may sequentially spray the processing gases.

The gas supplier may include: a first gas supplier configured to supply some of the processing gases to the shower head; and a second gas supplier formed separately from the first gas supplier and configured to supply other of the processing gases which are different from the processing gases supplied by the first gas supplier.

The second gas supplier may be connected to the first gas supplier, and the processing gases may be mixed and then supplied to the shower head.

The substrate supporter may face the shower head and move relative to the shower head.

According to one or more example embodiments, a method of manufacturing a display apparatus, includes: loading a substrate, on which a display unit is formed, into a chamber; and forming an inorganic layer on the display unit through atomic layer deposition (ALD) by receiving a processing gas from an external device. The inorganic layer is formed of a compound oxide including at least two of aluminum (Al), zinc (Zn), zirconium (Zr), and hafnium (Hf).

The forming of the inorganic layer may include: forming a first sub-inorganic layer including the compound oxide; and forming a second sub-inorganic layer including a compound oxide different from the compound oxide forming the first sub-inorganic layer.

The forming of the inorganic layer may include: forming a first sub-inorganic layer including the compound oxide; and forming a second sub-inorganic layer including one of a metal nitride and a metal oxide.

The inorganic layer may be amorphous.

A thickness of the inorganic layer may be less than or equal to 10 nm.

The substrate may be formed of polyimide.

The method may further include stacking an organic layer on the inorganic layer.

The inorganic layer may be a multilayer including different materials.

According to one or more example embodiments, a method of manufacturing a display apparatus, includes: loading a substrate, on which a display unit is formed, into a chamber; and forming an inorganic layer on the display unit through atomic layer deposition (ALD) by receiving a processing gas from an external device. The forming includes: forming, on the display unit, a first sub-inorganic layer including one selected from the group consisting of an aluminum oxide (Al2O3), a zinc oxide (ZnO), a zirconium oxide (ZrO2), and a hafnium oxide (HfO2); and stacking, on the first sub-inorganic layer, a second sub-inorganic layer including another one selected from the group consisting of Al2O3, ZnO, ZrO2, and HfO2.

These general and specific embodiments may be implemented by using a system, a method, a computer program, or a combination thereof.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
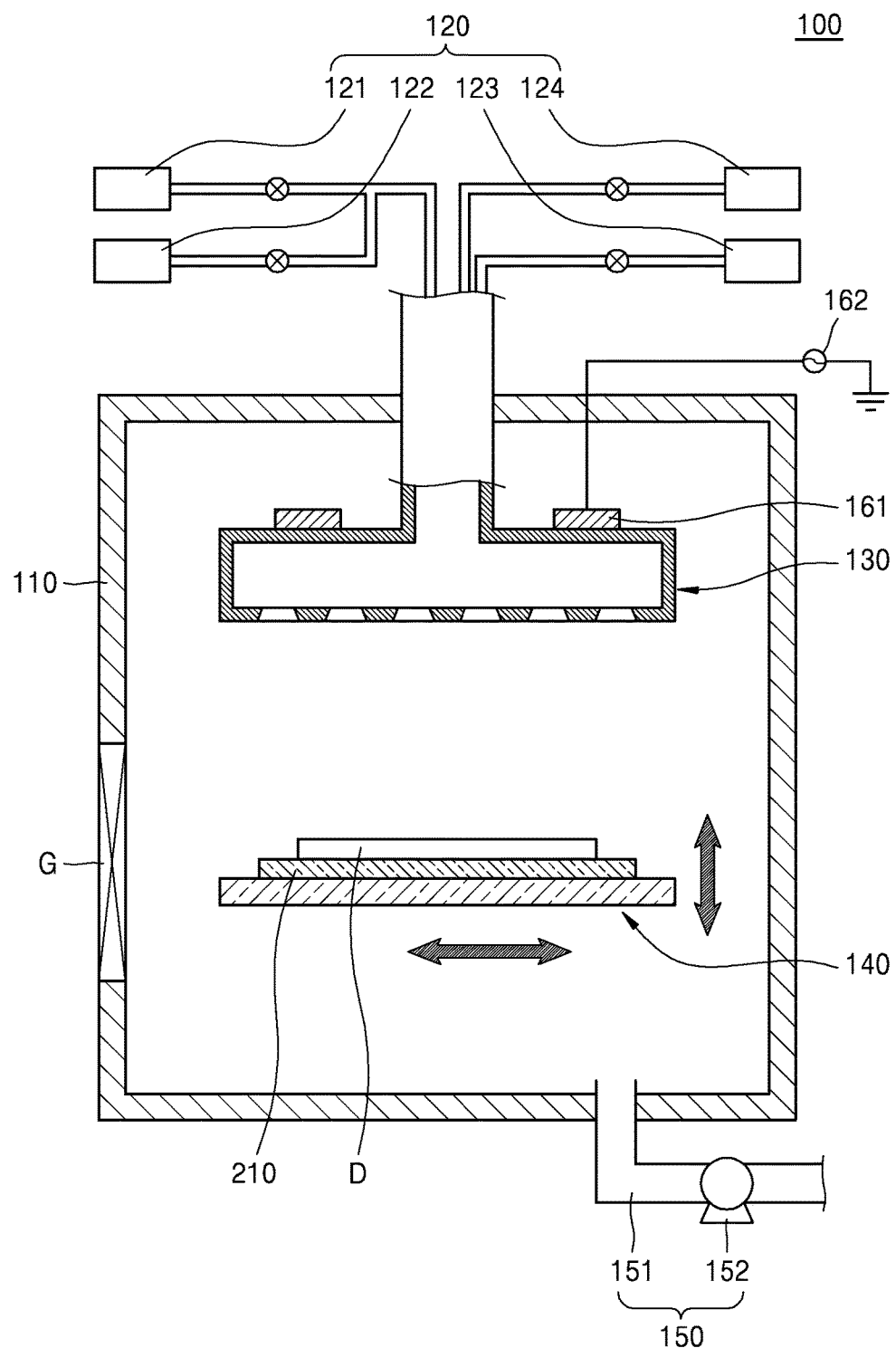
FIG. 1 is a conceptual view of an apparatus for manufacturing a display apparatus according to an example embodiment.

As the inventive concept allows for various changes and numerous example embodiments, particular example embodiments will be illustrated in the drawings and described in more detail in the written description. The attached drawings for illustrating example embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the example embodiments set forth herein.

Hereinafter, the inventive concept will be described in more detail by explaining example embodiments of the inventive concept with reference to the attached drawings. Like reference numerals in the drawings denote like elements.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following example embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

When a certain example embodiment may be implemented differently, a specific process order may be performed differently from the described order. For example, two consecutively described processes may be performed substantially at the same time or performed in an order opposite to the described order.

Figure 2:
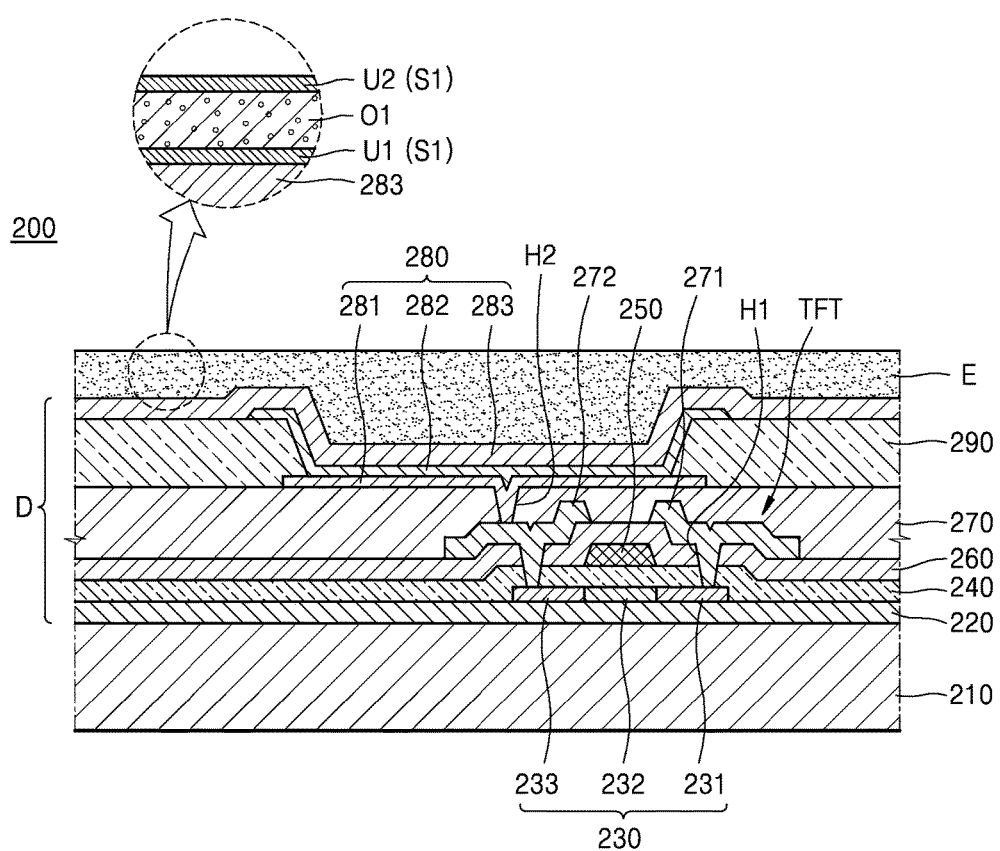
FIG. 2 is a cross-sectional view illustrating a portion of an example of a display apparatus manufactured by the apparatus of FIG. 1.
Figure 3:
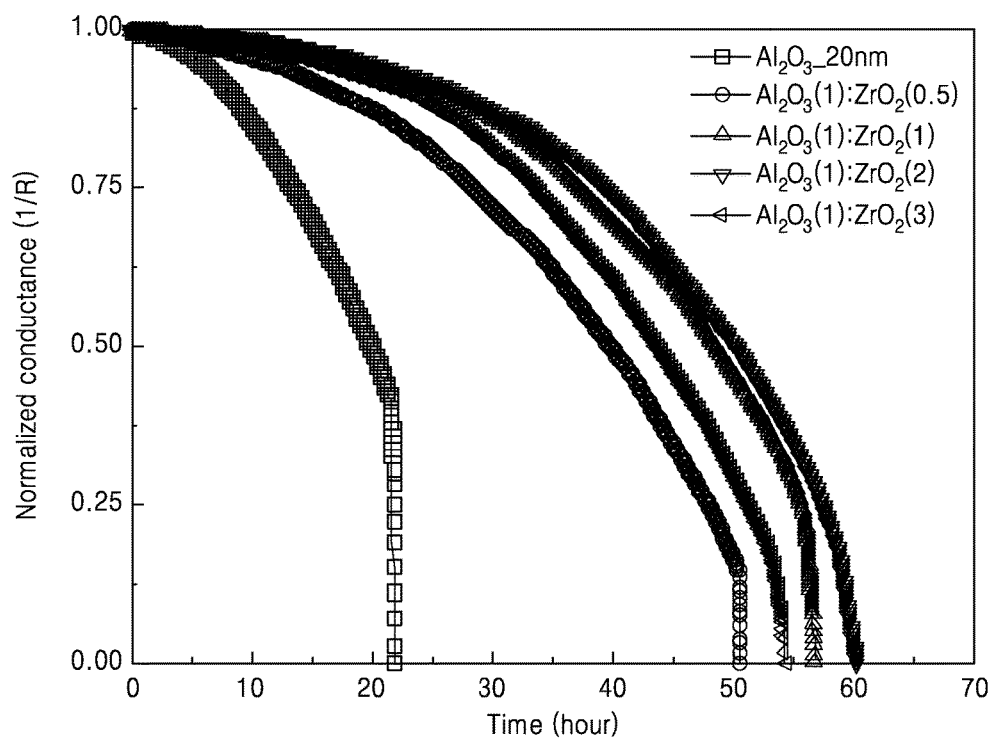
FIG. 3 is a graph for explaining a performance of the display apparatus of FIG. 2.

FIG. 1 is a conceptual view of an apparatus 100 for manufacturing a display apparatus according to an example embodiment, FIG. 2 is a cross-sectional view illustrating a portion of an example of a display apparatus manufactured by the apparatus of FIG. 1, and FIG. 3 is a graph for explaining the performance of the display apparatus of FIG. 2.

Referring to FIGS. 1 to 3, the apparatus 100 may include a chamber 110, a gas supplier 120, a shower head 130, a substrate supporter 140, and a discharge unit 150.

The chamber 110 may have an inner space and openings at some portions for connection to external devices. In this case, the openings may include a device or structure, for example, a gate valve, configured to open and shut the openings.

The gas supplier 120 is installed outside the chamber 110 and may supply a processing gas inside the chamber 110. The processing gas may include various types (kinds) of suitable gases. For example, the processing gas may include a first processing gas, a second processing gas, and a purge gas. In this case, the first processing gas may be a gas containing aluminum (Al) atoms such as trimethyl aluminium (TMA). Also, the first processing gas may be a gas containing zirconium (Zr) atoms such as tetrakis(dimethylamido)zirconium. The first processing gas may be a gas containing hafnium (Hf) atoms such as tetrakis(dimethylamido)hafnium (TDMAH). The first processing gas may be a gas containing zinc (Zn) atoms such as DiEthyl-Zinc (MEZ).

The second processing gas may be dihydrogen monoxide (H2O), dioxide (O2), nitrous oxide (N2O), or the like, which contains oxygen. Also, the purge gas may be an inert gas such as argon (Ar), helium (He), or neon (Ne).

The gas supplier 120 may include a first gas supplier 121 for supplying a first processing gas, a second gas supplier 122 for supplying a first processing gas, a third gas supplier 123 for supplying a second processing gas, and a fourth gas supplier 124 for supplying a purge gas. In this case, the first processing gas supplied by the first gas supplier 121 may be different from the first processing gas supplied by the second gas supplier 122.

As another example, the gas supplier 120 may include a first gas supplier 121 for supplying a first processing gas, a second gas supplier 122 for supplying a first processing gas, a third gas supplier 123 for supplying a first processing gas, a fourth gas supplier 124 supplying a second processing gas, and a fifth gas supplier (not shown) for supplying a purge gas. In this case, the first processing gases supplied by the first to third gas suppliers 121 to 123 may be different from each other. For example, the first processing gas supplied by the first gas supplier 121 may contain TMA. Also, the first processing gas supplied by the second gas supplier 122 may contain tetrakis(dimethylamido)zirconium. The first processing gas supplied by the third gas supplier 123 may contain TDMAH. Hereinafter, a case where the gas supplier 120 includes the first gas supplier 121 to the fourth gas supplier 124 will be mainly described for convenience.

The shower head 130 may be installed in the chamber 110. In this case, the shower head 130 may include the first gas supplier 121 to the fourth gas supplier 124. Also, the shower head 130 may facilitate a reaction by applying thermal energy to the processing gas or converting some portions of the processing gas into plasma.

The shower head 130 may be separately connected to the first gas supplier 121 to the fourth gas supplier 124. In this case, the first gas supplier 121 and the second gas supplier 122 are separately arranged outside the chamber 110 and may supply a mixture of a first processing gas and a second processing gas to the shower head 130. Also, the third gas supplier 123 is separately arranged outside the chamber 110 and may supply a third processing gas to the shower head 130. In this case, the third processing gas may be mixed with the first processing gas and the second processing gas within the shower head 130 or the chamber 110. On the contrary, the fourth gas supplier 124 is separately arranged outside the chamber 110 and may supply the purge gas to the shower head 130. In this case, the purge gas may be separately supplied to the chamber 110 via the shower head 130. Also, the purge gas is supplied to the inside of the shower head 130 such that an inner gas may be discharged to the outside or the purge gas may be supplied to the inside of the chamber 110 via the shower head 130. As another example, the purge gas may be supplied only to the inside of the chamber via the shower head 130.

The shower head 130 may include nozzles configured to spray the processing gas into the chamber 110. In this case, the nozzles may be of a hole type (e.g., may be through openings or holes) that penetrates the shower head 130.

The substrate supporter 140 may support a substrate 210 on which a display unit D is formed. In this case, the substrate supporter 140 may include a heater (not shown) capable of heating the substrate 210, according to one or more example embodiments. Hereinafter, a case where the substrate supporter 140 does not include the heater will be mainly described for convenience.

The substrate supporter 140 may move relative to the shower head 130. For example, the shower head 130 may be fixed to the chamber 110, and the substrate supporter 140 may move linearly. As another example, the shower head 130 and the substrate supporter 140 may move linearly. As another example, the substrate supporter 140 may be fixed to the chamber 110 and the shower head 130 may move linearly. Hereinafter, a case where the shower head 130 is fixed to the chamber 110, and the substrate supporter 140 moves linearly will be described in more detail for convenience.

The substrate supporter 140 may move linearly. For example, the substrate supporter 140 may move linearly in a first direction of the chamber 110. Also, the substrate supporter 140 may move linearly in a second direction of the chamber 110. In this case, the first direction may be different from the second direction. For example, the first direction may be perpendicular to the second direction. In particular, the first direction may be a height-wise direction of the chamber 110, and the second direction may be a widthwise (or lengthwise) direction.

The discharge unit 150 is connected to the chamber 110 and may discharge a gas from the chamber 110 to the outside. The discharge unit 150 is connected to the chamber 110 and may include a guide pipe 151 for guiding a gas and a pump 152 installed in the guide pipe 151.

With regard to operations of the apparatus 100, the substrate 210, on which the display unit D is formed, may be loaded into the chamber 110 from the outside. In this case, the substrate 210 may be transported to the chamber 110 via a robot arm, a shuttle, etc.

The display unit D may be formed on the substrate 210. In this case, the display unit D includes a thin film transistor (TFT), a passivation layer 270 formed to cover the TFT, and an organic light-emitting diode (OLED) 280 formed on the passivation layer 270. Hereinafter, the display apparatus 200 will be described in more detail.

The substrate 210 may include plastics or polyimide (PI). Hereinafter, a case where the substrate 210 includes PI will be described in more detail for convenience.

A buffer layer 220 including an organic compound and/or an inorganic compound is further formed on the substrate 210 and may include silicon oxide (SiOx) (x≥1) and silicon nitride (SiNx) (x≥1).

After an active layer 230 arranged in a set or predetermined pattern is formed on the buffer layer 220, the active layer 230 is covered or buried by a gate insulating layer 240. The active layer 230 includes a source area 231, a drain area 233, and a channel area 232 therebetween.

The active layer 230 may include various suitable materials. For example, the active layer 230 may contain an inorganic semiconductor material such as amorphous silicon, or crystalline silicon. As another example, the active layer 230 may contain an oxide semiconductor material. As another example, the active layer 230 may contain an organic semiconductor material. Hereinafter, for convenience of explanation, a case where the active layer 230 includes amorphous silicon will be described in more detail.

After an amorphous silicon layer is formed on the buffer layer 220, the amorphous silicon layer is crystallized to form a crystalline silicon layer, and the active layer 230 may be formed by patterning the crystalline silicon layer. The source area 231 and the drain area 233 of the active layer 230 are doped with impurities in accordance with types (kinds) of TFTs such as a driving TFT, a switching TFT, etc. to be formed.

A gate electrode 250 corresponding to the active layer 230 and an interlayer insulating layer 260 covering or burying the gate electrode 250 are formed on the gate insulating layer 240.

A contact hole H1 is formed in the interlayer insulating layer 260 and the gate insulating layer 240, and a source electrode 271 and a drain electrode 272 formed on the interlayer insulating layer 260 respectively contact the source area 231 and the drain area 233.

The passivation layer 270 is formed on the TFT, and a pixel electrode 281 of the OLED 280 is formed on the passivation layer 270. The pixel electrode 281 contacts the drain electrode 272 of the TFT via a via hole H2 formed in the passivation layer 270. The passivation layer 270 may be formed of an inorganic and/or organic material and may be a single layer or multilayer. The passivation layer 270 may be a planarization layer having a flat upper surface regardless of whether the lower surface thereof is even or uneven or an upper surface having uneven portions corresponding to uneven portions of the lower surface thereof. In one embodiment, the passivation layer 270 is formed by using a transparent insulating material in order to accomplish a resonance effect.

After the pixel electrode 281 is formed on the passivation layer 270, a pixel-defining layer 290 is formed of an organic and/or inorganic material in order to cover the pixel electrode 281 and the passivation layer 270, and an opening is formed to expose the pixel electrode 281.

An intermediate layer 282 and an opposite electrode 283 are formed at least on the pixel electrode 281.

The pixel electrode 281 functions as an anode, and the opposite electrode 283 functions as a cathode, or vice versa.

The pixel electrode 281 is insulated from the opposite electrode 283 by the intermediate layer 282, and an organic emission layer may emit light by applying voltages having different polarities to the intermediate layer 282.

The intermediate layer 282 may include an organic emission layer. As a selective example, the intermediate layer 282 includes the organic emission layer and may further include at least one of (at least one selected from) a hole injection layer (HIL), a hole transport layer (HTL), an electron transport layer (ETL), and an electron injection layer (EIL).

A unit pixel includes a plurality of sub-pixels, and the sub-pixels may emit light of various colors. For example, the unit pixel may include the sub-pixels that respectively emit red light, green light, and blue light and/or the sub-pixels that respectively emit red light, green light, blue light, and white light.

A thin film encapsulation layer E may include a plurality of inorganic layers, an inorganic layer and/or an organic layer, and/or a plurality of organic layers.

The organic layer of the thin film encapsulation layer E includes a polymer and may be a single layer or a stack layer including at least one selected from the group consisting of polyethyleneterephthalate, polyimide, polycarbonate, epoxy, polyethylene, and polyacrylate. Alternatively, the organic layer may include polyacrylate, and in more detail, the organic layer may include a polymerized monomer composition including a diacrylate-based monomer and triacrylate-based monomer. The monomer composition may further include a monoacrylate-based monomer. Also, the monomer composition may further include any suitable photo initiator such as TPO, but is not limited thereto.

The inorganic layer of the thin film encapsulation layer E may be a single layer or a stack layer including at least one of a metal compound oxide, a metal oxide, and a metal nitride.

An uppermost layer of the thin film encapsulation layer E, which is exposed to the outside, may be an inorganic layer in order to prevent moisture from penetrating the OLED 280.

The thin film encapsulation layer E may have at least one sandwich structure including at least one organic layer between at least two inorganic layers. As another example, the thin film encapsulation layer E may have at least one sandwich structure including at least one inorganic layer between at least two organic layers. As another example, the thin film encapsulation layer E may have at least one sandwich structure including at least one organic layer between at least two inorganic layers and at least one sandwich structure in which at least one inorganic layer is disposed between at least two organic layers.

The thin film encapsulation layer E may sequentially include, from an upper surface of the OLED 280, a first inorganic layer, a first organic layer, and a second inorganic layer.

As another example, the thin film encapsulation layer E may sequentially include, from the upper surface of the OLED 280, a first inorganic layer, a first organic layer, a second inorganic layer, a second organic layer, and a third inorganic layer.

As another example, the thin film encapsulation layer E may sequentially include, from an upper surface of the OLED 280, a first inorganic layer, a first organic layer, a second inorganic layer, a second organic layer, a third inorganic layer, a third organic layer, and a fourth inorganic layer.

A halogenated metal layer including lithium fluoride (LiF) may be further included between the OLED 280 and the first inorganic layer. The halogenated metal layer may prevent the OLED from being damaged when the first inorganic layer is formed by sputtering.

An area of the first organic layer may be less than that of the second inorganic layer, and an area of the second organic layer may be less than that of the third inorganic layer.

Hereinafter, a case where the thin film encapsulation layer E includes a first inorganic layer U1, a first organic layer O1, and a second inorganic layer U2 will be described in more detail for convenience.

At least one of the first inorganic layer U1 and the second inorganic layer U2 may include a compound oxide including at least two of aluminum (Al), zinc (Zn), zirconium (Zr), and hafnium (Hf). For example, one of the first inorganic layer U1 and the second inorganic layer U2 is formed of the above compound oxide, and the other of the first inorganic layer U1 and the second inorganic layer U2 includes a metal oxide or a nitride oxide. As another example, the first inorganic layer U1 and the second inorganic layer U2 include the above compound oxide. Hereinafter, since the first inorganic layer U1 and the second inorganic layer U2 include a compound oxide and are identically or similarly formed, the first inorganic layer U1 will be described in more detail for convenience.

The first inorganic layer U1 may include a compound oxide including at least two of Al, Zn, Zr, and Hf.

For example, the first inorganic layer U1 may include a compound oxide including two of (two selected from) Al, Zn, Zr, and Hf. In particular, in the above case, each element may share an oxygen atom and may exist in an (A,B)xOy form. Here, A may be one of Al, Zn, Zr, and Hf; and B may be another one of Al, Zn, Zr, and Hf. Also, x and y may be natural numbers.

For example, the first inorganic layer U1 may include a compound oxide including Al and Zn. Also, the first inorganic layer U1 may include a compound oxide including Al and Zr. The first inorganic layer U1 may include a compound oxide including Al and Hf. In this case, the first inorganic layer U1 is not limited thereto and may include a compound oxide including two of Al, Zn, Zr, and Hf.

As another example, the first inorganic layer U1 may include a compound oxide including three of Al, Zn, Zr, and Hf. In particular, in the above case, each element may share an oxygen atom and may exist in an (A,B,C)xOy form. Here, A may be one of Al, Zn, Zr, and Hf; B may be another one of Al, Zn, Zr, and Hf; and C may be the other of Al, Zn, Zr, and Hf. Also, x and y may be natural numbers.

For example, the first inorganic layer U1 may include a compound oxide including Al, Zn, and Zr. Also, the first inorganic layer U1 may include a compound oxide including Al, Zn, and Hf. In this case, the first inorganic layer U1 is not limited thereto and may include a compound oxide including three of Al, Zn, Zr, and Hf.

As described above, the first inorganic layer U1 may be a single layer or a multilayer.

In more detail, when the first inorganic layer U1 is a single layer, the first inorganic layer U1 may include a first sub-inorganic layer S1. In this case, the first sub-inorganic layer S1 may include at least one of the above-described compound oxides. For example, the first sub-inorganic layer S1 may include a compound oxide including Al and Zr. As another example, the first sub-inorganic layer S1 may be a single layer including a compound oxide including Al and Zr and a compound oxide including Zr and Hf.

When the first inorganic layer U1 is a multilayer, the first inorganic layer U1 may include a first sub-inorganic layer and a second sub-inorganic layer. In this case, at least one of the first sub-inorganic layer and the second sub-inorganic layer may include the above-described compound oxides.

For example, the first sub-inorganic layer and the second sub-inorganic layer may include compound oxides. In this case, the first sub-inorganic layer and the second sub-inorganic layer may include different compound oxides. For example, the first sub-inorganic layer may be formed of a compound oxide including Al and Zr, and the second sub-inorganic layer may include a compound oxide including Al and Hf. In this case, the first sub-inorganic layer and the second sub-inorganic layer are not limited thereto and may include compound oxides including various suitable combinations of Al, Zn, Zr, and Hf.

As another example, one of the first sub-inorganic layer and the second sub-inorganic layer includes the above compound oxide, and the other of the first sub-inorganic layer and the second sub-inorganic layer includes at least one of a metal oxide and a metal nitride. For example, the first sub-inorganic layer may include a compound oxide including Al and Zr, and the second sub-inorganic layer may include an aluminum oxide (Al2O3). In this case, the above-described metal oxide and metal nitride may include other materials for forming inorganic layers of a thin-film encapsulation layer for a display apparatus.

As another example, the first inorganic layer U1 may include a plurality of first sub-inorganic layers including a compound oxide and a plurality of second sub-inorganic layers including a single metal oxide or a single metal nitride.

Hereinafter, a case where the first inorganic layer U1 includes a first sub-inorganic layer S1 including a single compound oxide will be described in more detail for convenience. Also, a case where the first sub-inorganic layer S1 includes a compound oxide including Al and Zr will be described in more detail for convenience.

A first organic layer O1 and a second inorganic layer U2 may be sequentially stacked on the first sub-inorganic layer S1. In this case, the first organic layer O1 and the second inorganic layer U2 are identical or similar to the above-described first organic layer O1 and first inorganic layer U1, and thus, detailed description thereof will be omitted.

According to a method of manufacturing the display apparatus 200, the display unit D is formed on the substrate 210, and then the substrate 210 may be loaded into the chamber 110. In this case, the substrate 210 may be loaded by using a robot arm, a shuttle, etc.

The substrate 210 loaded into the chamber 110 may be mounted on the substrate supporter 140. In this case, the substrate supporter 140 may move linearly in a height-wise direction (or a second direction) of the chamber 110. Also, the first gas supplier 121 and the second gas supplier 122 may respectively supply the first processing gas and the second processing gas to the shower head 130. In this case, the second processing gas supplied to the shower head 130 from the second gas supplier 122 may be mixed with the first processing gas before the second processing gas is supplied to the inside of the chamber 110. For example, a mixture of the first processing gas and the second processing gas may be supplied to the shower head 130 because the second gas supplier 122 is connected to the first gas supplier 121. In this case, the first processing gas and the second processing gas may include inert carrier cases such as nitrogen (N2).

The mixture of the first processing gas and the second processing gas may be sprayed onto the substrate 210 via the shower head 130, and the fourth gas supplier 124 may spray the purge gas to the shower head 130.

Also, the third gas supplier 123 sprays the third processing gas via the shower head 130 so that the first sub-inorganic layer S1 is formed on the display unit D and the substrate 210. Accordingly, the first inorganic layer U1 may be formed.

In the above-described case, energy is applied to the third processing gas to facilitate a reaction of the third processing gas with the first processing gas and the second processing gas. For example, a power supplier 162 supplies power to electrodes 161, and thus, the third processing gas may be converted into plasma. In this case, as another example, reactions of the first processing gas, the second processing gas, and the third processing gas may be facilitated by heating a substrate via a heater of the substrate supporter 140, directly applying thermal energy to the third processing gas, etc. Also, the reactions may be facilitated without separately applying energy to the third processing gas. Hereinafter, a case where the third processing gas is converted into plasma to facilitate reactions will be described in more detail.

As described above, while the first sub-inorganic layer S1 is formed, the substrate supporter 140 and the shower head 130 may move relative to each other. For example, the substrate supporter 140 may move linearly in a widthwise direction (a lengthwise direction or a first direction) of the chamber 110. Therefore, the first sub-inorganic layer S1 may be evenly formed on the display unit D and the substrate 210 due to the linear motion of the substrate supporter 140.

A thickness of the first sub-inorganic layer S1 may be less than or equal to 10 nm. In this case, the first sub-inorganic layer S1 may be amorphous. In more detail, if the thickness of the first sub-inorganic layer S1 is greater than 10 nm, metallic materials in the first sub-inorganic layer S1 are crystallized, and thus, cracks or an internal space may be generated in the first sub-inorganic layer S1. In particular, if the thickness of the first sub-inorganic layer S1 is greater than 10 nm, when the display apparatus 200 is bent or folded, the first sub-inorganic layer S1 is damaged, and accordingly, flexibility of the display apparatus 200 may not be secured.

After the above processes are completed, the substrate 210 may be transported to the outside or to another chamber connected to the chamber 110, and then the first organic layer O1 may be deposited on the first inorganic layer U1. Also, after the first organic layer O1 is formed, the second inorganic layer U2 having the same material as the first inorganic layer U1 is deposited on the first organic layer O1 so that the thin film encapsulation layer E may be formed on the display unit D.

While the above process is performed, the discharge unit 150 may discharge a gas from the chamber 110 to the outside. Also, when the substrate 210 is loaded into the chamber 110, the discharge unit 150 may adjust an internal pressure of the chamber 110 to be the same as the atmospheric pressure.

Compared with an existing display apparatus, the above display apparatus 200 may have better moisture barrier and light transmission properties. In more detail, FIG. 3 shows results of a calcium test for determining a time until complete oxidation is achieved due to moisture penetrating a moisture barrier thin film. In this case, the time until complete oxidation is achieved is measured. It is considered that complete oxidation is achieved when conductive calcium is oxidized by moisture and then changed into a calcium oxide (CaO), thereby decreasing the electric conductivity of the calcium. In more detail, the longer the measured time is, the better a moisture barrier property of the moisture barrier thin film is. The above test was performed under the conditions of a temperature of 85° C. and a relative humidity of 85%.

Referring to the results of FIG. 3, a thin film including pure Al2O3 and having a uniform thickness withstands moisture for about 22 hours, but a compound oxide thin film withstands moisture for about 50 hours or more. In particular, regardless of a mass ratio of Al and Zr forming the compound oxide thin film, the compound oxide thin film has a better moisture barrier property than an existing thin film including Al2O3. Also, the moisture barrier property of the compound oxide thin film is at least twice as high as that of the thin film formed of Al2O3.

Therefore, the display apparatus 200 manufactured by the apparatus 100, the apparatus 100, and the method described above may have an improved moisture barrier property. Also, the display apparatus 200 manufactured by the apparatus 100, the apparatus 100, and the method described above may have increased durability and the thickness of the thin film encapsulation layer E may be reduced or minimized.

Figure 4:
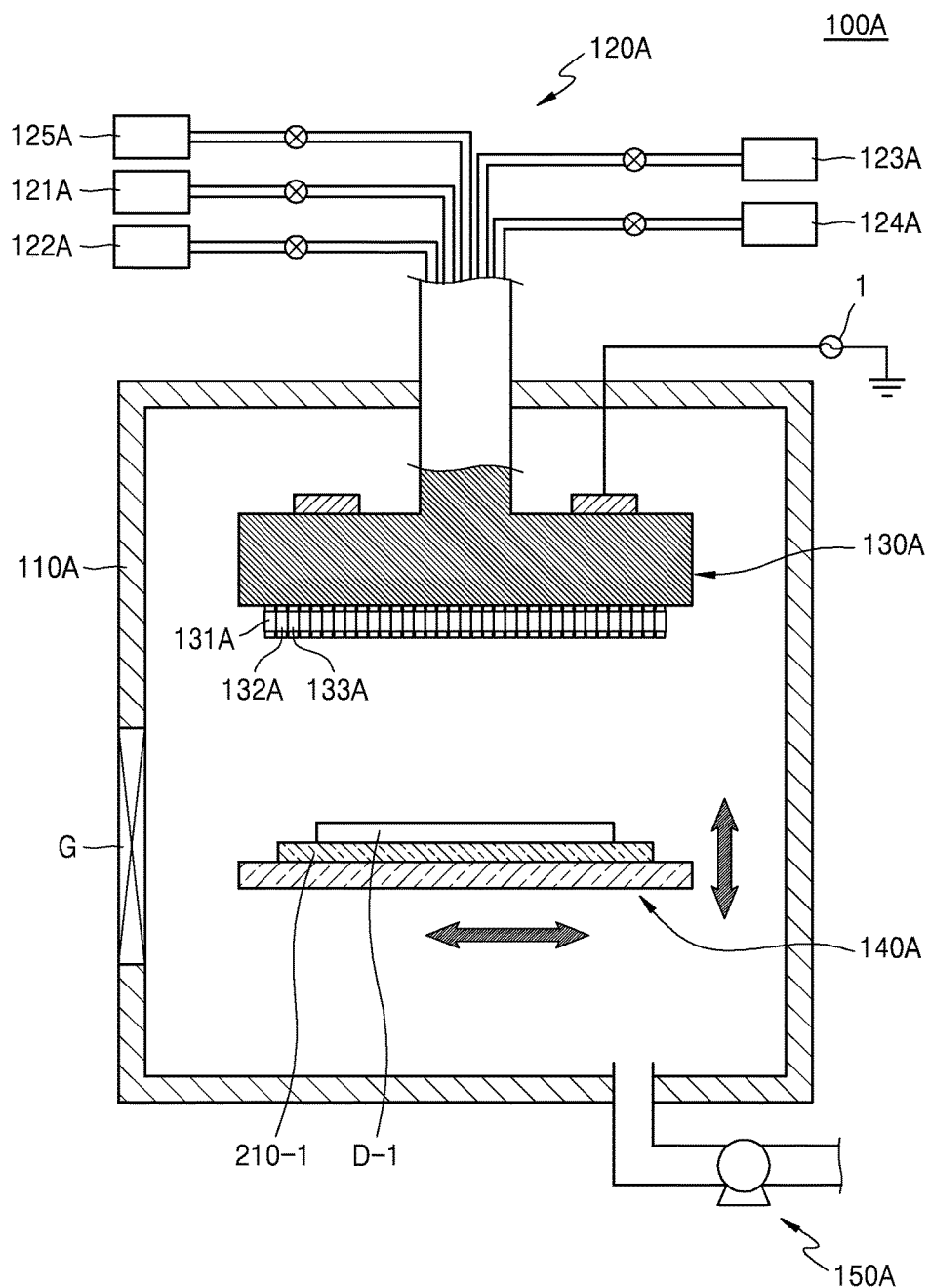
FIG. 4 is a conceptual view of an apparatus for manufacturing a display apparatus according to another example embodiment.
Figure 5:
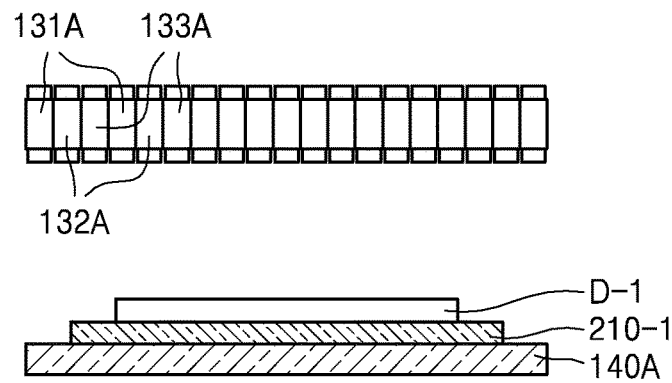
FIG. 5 is a conceptual view of a portion of a shower head of the apparatus of FIG. 4.
Figure 6:
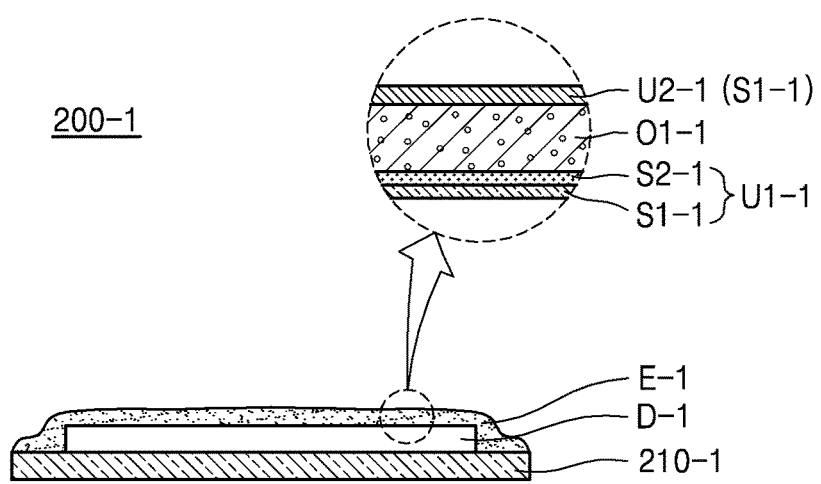
FIG. 6 is a cross-sectional view illustrating a portion of an example of a display apparatus manufactured by the apparatus of FIG. 4.

FIG. 4 is a conceptual view of an apparatus 100A for manufacturing a display apparatus according to another example embodiment, FIG. 5 is a conceptual view of a portion of a shower head 130A of the apparatus 100A of FIG. 4, and FIG. 6 is a cross-sectional view illustrating a portion of an example of a display apparatus manufactured by the apparatus 100A of FIG. 4.

Referring to FIGS. 4 to 6, the apparatus 100A may include a chamber 110A, a gas supplier 120A, a shower head 130A, a substrate supporter 140A, and a discharge unit 150A. In this case, the chamber 110A, the substrate supporter 140A, and the discharge unit 150A are identical or similar to the chamber 110, the substrate supporter 140, and the discharge unit 150, respectively, described with reference to FIGS. 1 to 3, and thus, detailed descriptions thereof will be omitted.

The gas supplier 120A may include a first gas supplier 121A, a second gas supplier 122A, a third gas supplier 123A, a fourth gas supplier 124A, and a fifth gas supplier 125A. In this case, the first to fourth gas suppliers 121A to 124A are identical or similar to the first to fourth gas suppliers 121 to 124, respectively, described above, and thus, detailed descriptions thereof will be omitted.

The fifth gas supplier 125A may supply a fourth processing gas different from the first to third processing gases. In this case, the fourth processing gas may be identical or similar to the first processing gas and the second processing gas, respectively, and thus, detailed descriptions thereof will be omitted.

The shower head 130A may include a first spraying unit 131A, a second spraying unit 131B, and a third spraying unit 131C. In this case, the first spraying unit 131A is connected to the first gas supplier 121A and may spray the first processing gas. Also, the second spraying unit 131B is connected to the second gas supplier 122A and may spray the second processing gas. The third spraying unit 131C is connected to the fifth gas supplier 125A and may spray the third processing gas.

The first to third spraying units 131A to 131C may be arranged adjacent to each other. In this case, the number of each of the first to third spraying units 131A to 131C may vary. In particular, each of the first to third spraying units 131A to 131C forms a group, and the group may be repeatedly formed on the shower head 130A. In this case, the first to third spraying units 131A to 131C are identically formed on a surface of the shower head 130A, and thus, a dilution concentration of the first processing gas, the second processing gas, and the fifth processing gas may be uniformly maintained.

According to a method of manufacturing a display apparatus 200-1, a substrate 210-1 is loaded on the chamber 110A and mounted on the substrate supporter 140A, and then a first organic layer U1-1 may be formed on a display unit D-1 and the substrate 210-1. In more detail, a first sub-inorganic layer S1-1 may be formed on a display unit D-1 and the substrate 210-1.

The first processing gas and the second processing gas are supplied via the shower head 130A and may be sprayed onto the display unit D-1 and the substrate 210-1 via the first spraying unit 131A and the second spraying unit 131B. In this case, the first processing gas and the second processing gas may be respectively supplied to the first spraying unit 131A and the second spraying unit 131B. Also, while the first spraying unit 131A sprays the first processing gas, the second spraying unit 131B may concurrently (e.g., simultaneously) spray the second processing gas onto the display unit D-1 and the substrate 210-1. As another example, after one of the first spraying unit 131A and the second spraying unit 131B sprays a processing gas, the other of the first spraying unit 131A and the second spraying unit 131B may spray another processing gas. Hereinafter, a case where the first spraying unit 131A and the second spraying unit 131B concurrently (e.g., simultaneously) spray the first processing gas and the second processing gas will be described in more detail for convenience.

As described above, after the first processing gas and the second processing gas are supplied to the first spraying unit 131A and the second spraying unit 131B, the third gas supplier 123A sprays the purge gas onto the display unit D-1 and the substrate 210-1 via the shower head 130A and may spray the third processing gas supplied from the fourth gas supplier 124A onto the display unit D-1 and the substrate 210-1. Then, the formation of the first sub-inorganic layer S1-1 may be completed by spraying, by the third gas supplier 123A, the purge gas via the shower head 130A.

The first sub-inorganic layer S1-1 may include various suitable compound oxides in accordance with types (kinds) of the first processing gas and the second processing gas. For example, the first sub-inorganic layer S1-1 may include a compound oxide including at least two of Al, Zn, Zr, and Hf. Hereinafter, a case where the first sub-inorganic layer S1-1 includes a compound oxide including Al and Zr will be described in more detail for convenience.

A second sub-inorganic layer S2-1 may be stacked on the first sub-inorganic layer S1-1. In this case, the second sub-inorganic layer S2-1 may include a compound oxide different from the compound oxide of the first sub-inorganic layer S1-1. For example, the second sub-inorganic layer S2-1 may include a compound oxide including at least two of Al, Zn, Zr, and Hf. Hereinafter, a case where the second sub-inorganic layer S2-1 includes a compound oxide including Al and Hf will be described in more detail for convenience.

The second sub-inorganic layer S2-1 may be similar to the first sub-inorganic layer S1-1. For example, the first gas supplier 121A and the fifth gas supplier 125A may spray the first processing gas and the fifth processing gas onto the display unit D-1 and the substrate 210-1 via the first spraying unit 131A and the third spraying unit 131C. In this case, the first processing gas and the fifth processing gas may be currently (e.g., simultaneously) or sequentially sprayed via the first spraying unit 131A and the third spraying unit 131C. Hereinafter, a case where the first processing gas and the fifth processing gas are currently (e.g., simultaneously) sprayed via the first spraying unit 131A and the third spraying unit 131C will be described in more detail for convenience.

Also, the purge gas supplied from the third gas supplier 123A may be sprayed onto the display unit D-1 and the substrate 210-1 via the shower head 130A. The fourth gas supplier 124A may spray the third processing gas onto the display unit D-1 and the substrate 210-1 via the shower head 130A.

After the above-described processes are completed, the second sub-inorganic layer S2-1 may be stacked on the first sub-inorganic layer S1-1. In this case, the first sub-inorganic layer S1-1 and the second sub-inorganic layer S2-1 may form the first organic layer U1-1.

A first organic layer O1-1 and a second inorganic layer U2-1 may be formed on the first organic layer U1-1. In this case, the second inorganic layer U2-1 may include the first sub-inorganic layer S1-1. In particular, the first sub-inorganic layer S1-1 of the second inorganic layer U2-1 may be identical to the first sub-inorganic layer S1-1 of the first organic layer U1-1, and thus, detailed descriptions thereof will be omitted.

After the formation of the second inorganic layer U2-1 is completed, the display unit D-1 may be completely blocked from the outside by placing a thin film encapsulation layer E-1 thereon.

Therefore, the display apparatus 200-1 may have improved moisture barrier property. In particular, since the first sub-inorganic layer S1-1 and the second sub-inorganic layer S2-1 are (each) densely formed in an amorphous form (phase), the display apparatus 200-1 may effectively protect the display unit D-1 from moisture and/or oxygen penetrating from the outside. That is, in one embodiment, the first sub-inorganic layer S1-1 and the second sub-inorganic layer S2-1 are each amorphous.

Also, according to a method of manufacturing the display apparatus 200-1 and the apparatus 100A, the first sub-inorganic layer S1 and a second sub-inorganic layer S2 are simply and quickly manufactured, thereby improving the manufacturing efficiency. In addition, the display apparatus 200-1 may have improved moisture barrier property and may be manufactured on a large scale.

Figure 7:
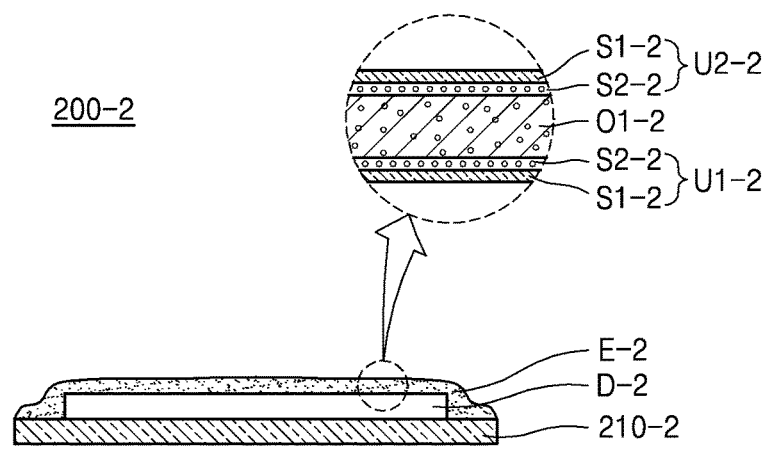
FIG. 7 is a cross-sectional view illustrating a portion of another example of a display apparatus manufactured by the apparatus of FIG. 4.

FIG. 7 is a cross-sectional view illustrating a portion of another example of a display apparatus 200-2 manufactured by the apparatus of FIG. 4.

Referring to FIG. 7, the display apparatus 200-2 may include a substrate 210-2, a display unit D-2, and a thin film encapsulation layer E-2. In this case, the substrate 210-2 and the display unit D-2 are identical or similar to the substrate 210 and the display unit D, respectively, described with reference to FIGS. 1 to 3, and thus, detailed description thereof will be omitted.

The thin film encapsulation layer E-2 may include an inorganic layer and an organic layer. Hereinafter, a case where the thin film encapsulation layer E-2 includes a first inorganic layer U1-2, a first organic layer O1-2, and a second inorganic layer U2-2 will be described in more detail for convenience.

The first inorganic layer U1-2 may include a first sub-inorganic layer S1-2 and a second sub-inorganic layer S2-2. In this case, one of the first sub-inorganic layer S1-2 and the second sub-inorganic layer S2-2 may be formed of a compound oxide including at least two of Al, Zn, Zr, and Hf. Also, the other of the first sub-inorganic layer S1-2 and the second sub-inorganic layer S2-2 may include a metal oxide and/or a metal nitride. Hereinafter, a case where the first sub-inorganic layer S1-2 includes a compound oxide and the second sub-inorganic layer S2-2 includes a metal oxide will be described in more detail for convenience.

After the display unit D-2 is formed on the substrate 210-2, the first inorganic layer U1-2 may be formed on the display unit D-2 and the substrate 210-2. In more detail, the first sub-inorganic layer S1-2 may be formed by spraying the first processing gas and the second processing gas onto the display unit D-2 and the substrate 210-2 and then sequentially spraying the purge gas, the third processing gas, and then purge gas again onto the display unit D-2 and the substrate 210-2.

Also, the second sub-inorganic layer S2-2 may be formed by spraying the first processing gas and then sequentially spraying the purge gas, the third processing gas and then purge gas again onto the display unit D-2 and the substrate 210-2. In this case, the third processing gas may be an ammonia gas, etc. in order to form the second sub-inorganic layer S2-2 by using a metal nitride.

When the first sub-inorganic layer S1-2 and the second sub-inorganic layer S2-2 are formed as described above, a compound oxide may be formed between the first sub-inorganic layer S1-2 and the second sub-inorganic layer S2-2 due to a material forming the first sub-inorganic layer S1-2 and the second sub-inorganic layer S2-2.

After the first inorganic layer U1-2 is formed, the first organic layer O1-2 and the second inorganic layer U2-2 may be sequentially formed. In this case, the second inorganic layer U2-2 may include the first sub-inorganic layer S1-2 and the second sub-inorganic layer S2-2.

In more detail, the second inorganic layer U2-2 may be formed to be opposite the first inorganic layer U1-2. For example, the first inorganic layer U1-2 may be formed by stacking the second sub-inorganic layer S2-2 on the first sub-inorganic layer S1-2. On the contrary, the second inorganic layer U2-2 may be formed by forming the second sub-inorganic layer S2-2 on the first organic layer O1-2 and then forming the first sub-inorganic layer S1-2 on the second sub-inorganic layer S2-2. In this case, a method of forming the first sub-inorganic layer S1-2 and the second sub-inorganic layer S2-2 of the second inorganic layer U2-2 is the same as a method of forming the first sub-inorganic layer S1-2 and the second sub-inorganic layer S2-2 of the first organic layer O1-2, and thus, detailed descriptions thereof will be omitted.

After the above-described process is completed, the thin film encapsulation layer E-2 may be formed on the display unit D-2 and the substrate 210-2.

Therefore, the display apparatus 200-2 may have an improved moisture barrier property. In particular, the display apparatus 200-2 may effectively protect the display unit D-2 from moisture and/or oxygen penetrating from the outside because the first sub-inorganic layer S1-2 and the second sub-inorganic layer S2-2 are (each) densely formed in an amorphous form (phase).

Also, the manufacturing efficiency may be increased by simply and quickly forming the first sub-inorganic layer S1-2 and the second sub-inorganic layer S2-2, according to the display apparatus and method described above. In addition, according to the display apparatus and method described above, the apparatus 200-2 may have an improved moisture barrier property and may be manufactured on a large scale.

Figure 8:
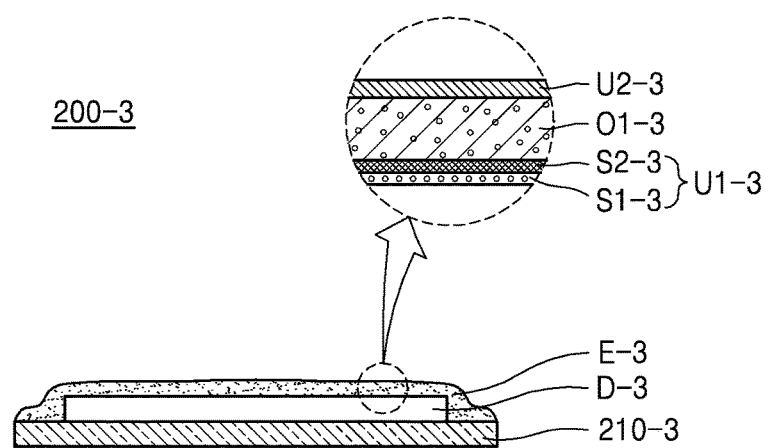
FIG. 8 is a cross-sectional view illustrating a portion of another example of a display apparatus manufactured by the apparatus of FIG. 4.
Figure 9:
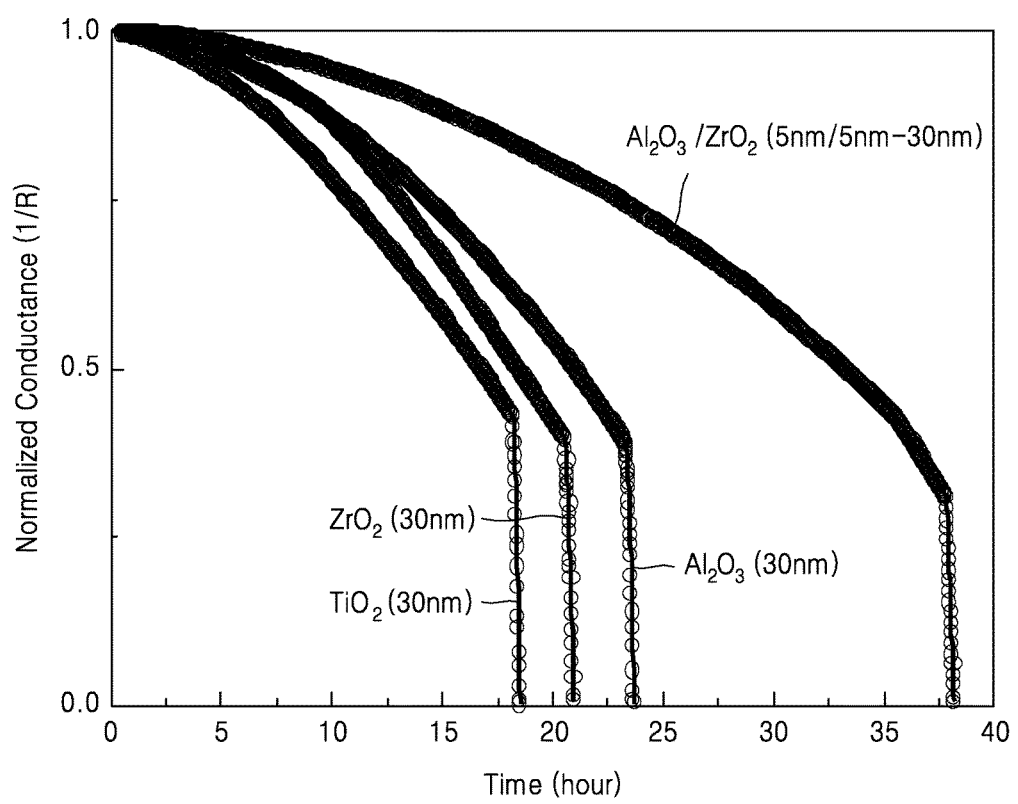
FIG. 9 is a graph for explaining a performance of the display apparatus of FIG. 8.

FIG. 8 is a cross-sectional view illustrating a portion of another example of a display apparatus 200-3 manufactured by the apparatus 100A of FIG. 4, and FIG. 9 is a graph for explaining the performance of the display apparatus 200-3 of FIG. 8.

Referring to FIG. 8, the display apparatus 200-3 may include a substrate 210-3, a display unit D-3, and a thin film encapsulation layer E-3. In this case, descriptions of the substrate 210-3 and the display unit D-3 are the same as the above descriptions and thus will not be repeated.

The thin film encapsulation layer E-3 may include a first inorganic layer U1-3, a first organic layer O1-3, and a second inorganic layer U2-3. In this case, descriptions of the first organic layer O1-3 are the same as the above descriptions and thus will not be repeated.

The first inorganic layer U1-3 may include a first sub-inorganic layer S1-3 and a second sub-inorganic layer S2-3. In this case, the first sub-inorganic layer S1-3 may be formed of one of an aluminum oxide (Al2O3), a zinc oxide (ZnO), a zirconium oxide (ZrO2), and a hafnium oxide (HfO2). Also, the second sub-inorganic layer S2-3 may be formed of another one of Al2O3, ZnO, ZrO2, and HfO2. That is, the first sub-inorganic layer S1-3 and the second sub-inorganic layer S2-3 may be formed of different metal oxides.

With regard to a method of forming the first sub-inorganic layer S1-3, the first sub-inorganic layer S1-3 may be formed by spraying the first processing gas onto the display unit D-3 and the substrate 210-3 and then sequentially spraying the purge gas, the third processing gas, and the purge gas onto the display unit D-3 and the substrate 210-3.

Also, the second sub-inorganic layer S2-3 may be formed by spraying the second processing gas onto the display unit D-3 and the substrate 210-3 and then sequentially spraying the purge gas, the third processing gas, and the purge gas onto the display unit D-3 and the substrate 210-3.

The first sub-inorganic layer S1-3 and the second sub-inorganic layer S2-3 may be formed of various metal oxides. Hereinafter, a case where the first sub-inorganic layer S1-3 is formed of Al2O3 and the second sub-inorganic layer S2-3 is formed of ZrO2 will be described in more detail for convenience.

After the second sub-inorganic layer S2-3 is formed as described above, the second inorganic layer U2-3 may be formed. In this case, the second inorganic layer U2-3 may be formed of a compound oxide including at least two of Al, Zn, Zr, and Hf.

The compound oxide is formed as described above, and thus, detailed description thereof will be omitted.

After the first inorganic layer U1-3, the first organic layer O1-3, and the second inorganic layer U2-3 are formed as described above, the thin film encapsulation layer E-3 may be formed on the display unit D-3 and the substrate 210-3. In this case, the thin film encapsulation layer E-3 may block or protect the display unit D-3 from the outside.

FIG. 9 shows results of a moisture barrier test performed for the first inorganic layer U1-3. Referring to FIG. 9, compared with an existing layer formed (without a compound oxide layer) of just Al2O3, ZrO2, or titanium oxide (TiO2), a moisture barrier property of the first inorganic layer U1-3 is at least twice as high as that of the existing layer. In this case, the test may be performed under the same conditions as described above.

Therefore, the display apparatus 200-3 may have an improved moisture barrier property. In particular, the display apparatus 200-3 may effectively protect the display unit D-3 from moisture and/or oxygen penetrating from the outside because the first sub-inorganic layer S1-3 and the second sub-inorganic layer S2-3 are (each) densely formed in an amorphous form (phase).

Also, the manufacturing efficiency with regard to the display apparatus 200-3 may be increased by simply and quickly forming the first sub-inorganic layer S1-3 and the second sub-inorganic layer S2-3 via the apparatus for and method of manufacturing the display apparatus. In addition, the display apparatus 200-3 may have an improved moisture barrier property and be manufactured on a large scale.

As described above, according to the one or more of the above example embodiments, a display apparatus may be manufactured to have an improved moisture barrier property by using the apparatus and method described above.

Expressions such as "one of," "two of," "at least one of," or "at least two of," when preceding a list of elements, modify the entire list of elements and do not modify the individual elements of the list. Further, the use of "may" when describing embodiments of the present invention refers to "one or more embodiments of the present invention."

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

As used herein, the terms "use," "using," and "used" may be considered synonymous with the terms "utilize," "utilizing," and "utilized," respectively.

It will be understood that when an element or layer is referred to as being "on" another element or layer, it can be directly on the other element or layer, or one or more intervening elements or layers may be present. In contrast, when an element or layer is referred to as being "directly on" another element or layer, there are no intervening elements or layers present.

The display apparatus, the apparatus for manufacturing the display apparatus and/or any other relevant apparatus or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

It should be understood that the example embodiments described therein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing a display apparatus, method comprising:
    loading a substrate, on which a display unit is formed, into a chamber; and
    forming an inorganic layer on the display unit through atomic layer deposition (ALD) by receiving a processing gas from an external device,
    wherein the inorganic layer is formed of a compound oxide comprising at least two of aluminum (Al), zinc (Zn), zirconium (Zr), and hafnium (Hf).

2. The method of claim 1, wherein the forming of the inorganic layer comprises:
    forming a first sub-inorganic layer comprising the compound oxide; and
    forming a second sub-inorganic layer comprising a compound oxide different from the compound oxide forming the first sub-inorganic layer.

3. The method of claim 1, wherein the forming of the inorganic layer comprises:
    forming a first sub-inorganic layer comprising the compound oxide; and
    forming a second sub-inorganic layer comprising one of a metal nitride and a metal oxide.

4. The method of claim 1, wherein the inorganic layer is amorphous.

5. The method of claim 1, wherein a thickness of the inorganic layer is less than or equal to 10 nm.

6. The method of claim 1, wherein the substrate is formed of polyimide.

7. The method of claim 1, further comprising stacking an organic layer on the inorganic layer.

8. The method of claim 1, wherein the inorganic layer is a multilayer comprising different materials.

9. The method of claim 1, wherein the forming of the inorganic layer comprises configuring a substrate supporter in the chamber to support the substrate, configuring a gas supplier to supply a plurality of processing gases comprising the processing gas to a shower head in the chamber, and configuring the shower head in the chamber to spray the processing gases.

10. The method of claim 9, wherein the shower head comprises:
    a first spraying unit; and
    a second spraying unit arranged adjacent to the first spraying unit,
    wherein the processing gases sprayed by the first spraying unit and the second spraying unit are different from one another.

11. The method of claim 10, wherein the first spraying unit and the second spraying unit concurrently spray the processing gases.

12. The method of claim 10, wherein the first spraying unit and the second spraying unit sequentially spray the processing gases.

13. The method of claim 9, wherein the configuring of the gas supplier comprises:
    configuring a first gas supplier to supply some of the processing gases to the shower head; and
    configuring a second gas supplier formed separately from the first gas supplier to supply other of the processing gases which are different from the processing gases supplied by the first gas supplier.

14. The method of claim 13, wherein the second gas supplier is connected to the first gas supplier, and the processing gases are mixed and then supplied to the shower head.

15. The method of claim 9, wherein the substrate supporter faces the shower head and moves relative to the shower head.

16. A method of manufacturing a display apparatus, the method comprising:

loading a substrate, on which a display unit is formed, into a chamber;

forming a first inorganic layer on the display unit through atomic layer deposition (ALD) by receiving a processing gas from an external device; and forming a second inorganic layer on the first inorganic layer through atomic layer deposition (ALD) by receiving a processing gas from an external device, wherein the second inorganic layer is formed of a compound oxide comprising at least two of aluminum (Al), zinc (Zn), zirconium (Zr), and hafnium (Hf);

wherein the forming of the first inorganic layer comprises:

forming, on the display unit, a first sub-inorganic layer comprising one selected from the group consisting of an aluminum oxide ($Al_2O_3$), a zinc oxide (ZnO), a zirconium oxide ($ZrO_2$), and a hafnium oxide ($HfO_2$); and stacking, on the first sub-inorganic layer, a second sub-inorganic layer comprising another one selected from the group consisting of $Al_2O_3$, ZnO, $ZrO_2$, and $HfO_2$.

17. A method of manufacturing a display apparatus, the method comprising:

loading a substrate, on which a display unit is formed, into a chamber; and forming an inorganic layer on the display unit through atomic layer deposition (ALD) by receiving a processing gas from an external device, wherein the forming comprises:

forming, on the display unit, a first sub-inorganic layer comprising one selected from the group consisting of an aluminum oxide ($Al_2O_3$), a zinc oxide (ZnO), a zirconium oxide ($ZrO_2$), and a hafnium oxide ($HfO_2$); and stacking, on the first sub-inorganic layer, a second sub-inorganic layer comprising another one selected from the group consisting of $Al_2O_3$, ZnO, $ZrO_2$, and $HfO_2$, different from the one comprised in the first sub-inorganic layer.

* * * * *